(12) United States Patent
Avery et al.

(10) Patent No.: US 6,501,632 B1
(45) Date of Patent: Dec. 31, 2002

(54) APPARATUS FOR PROVIDING HIGH PERFORMANCE ELECTROSTATIC DISCHARGE PROTECTION

(75) Inventors: Leslie Ronald Avery, Flemington, NJ (US); Christian Cornelius Russ, Princeton, NJ (US)

(73) Assignee: Sarnoff Corporation, Princeton, NJ (US)

( * ) Notice: Subject to any disclaimer, the term of this patent is extended or adjusted under 35 U.S.C. 154(b) by 125 days.

(21) Appl. No.: 09/632,414

(22) Filed: Aug. 4, 2000

Related U.S. Application Data
(60) Provisional application No. 60/147,945, filed on Aug. 6, 1999.

(51) Int. Cl.[7] ................................................ H02H 3/22
(52) U.S. Cl. ...................... 361/111; 361/56; 327/313; 327/534
(58) Field of Search .............................. 361/54, 56, 111; 327/309, 312, 313, 530, 534, 566; 257/355

(56) References Cited

U.S. PATENT DOCUMENTS

| | | | | |
|---|---|---|---|---|
| 5,528,188 A | * | 6/1996 | Au et al. .................... | 327/310 |
| 5,959,488 A | * | 9/1999 | Lin et al. .................... | 327/313 |
| 5,982,217 A | * | 11/1999 | Chen et al. ................. | 327/310 |
| 6,097,235 A | * | 8/2000 | Hsu et al. ................... | 327/309 |

* cited by examiner

*Primary Examiner*—Kim Huynh
(74) *Attorney, Agent, or Firm*—W. J. Burke

(57) ABSTRACT

Apparatus for providing electrostatic discharge protection having an nMOS transistor with bias simultaneously applied to the gate and the p-well of the nMOS transistor. A bias circuit is fabricated using a plurality of the Zener diodes. The double bias allows for a relatively high gate voltage to be applied to the nMOS transistor enabling the nMOS transistor to be biased to optimum conditions for bipolar snapback.

20 Claims, 3 Drawing Sheets

APPARATUS FOR PROVIDING HIGH PERFORMANCE ELECTROSTATIC DISCHARGE PROTECTION

This application claims the benefit of United States Provisional Application No. 60/147,945, filed Aug. 6, 1999, and is hereby incorporated herein by reference.

The invention relates to electrostatic discharge protection apparatus and, more particularly, the invention relates to nMOS devices for providing high performance electrostatic discharge protection to integrated circuits.

BACKGROUND OF THE DISCLOSURE

Integrated circuits are susceptible to damage from electrostatic discharge (ESD). When an ESD pulse or signal is applied to a conductive connection (e.g., a terminal, pin or pad) to an integrated circuit, the ESD pulse or signal may permanently or temporarily damage or otherwise impair the operation of the integrated circuit. To protect against such damage, the terminal, pin or pad of the integrated circuit is coupled to ground through an ESD protection device that shunts the ESD pulse or signal to ground such that the integrated circuit is not harmed by the discharge.

Grounded-gate nMOS transistors have been used for ESD protection for many years. FIG. 1 depicts a gate-coupled nMOS transistor that derives a gate bias voltage from an ESD pulse using a resistor-capacitor (RC) element. The fast transient of an ESD pulse causes a displacement current to flow in the capacitor C and accumulates a bias voltage across the resistor R. The common node of the RC element is connected to the gate of the nMOS structure. In a conventional gate-coupled nMOS transistor under ESD conditions, the device is driven into bipolar operation by avalanche breakdown of the drain p-well junction, followed by a phenomenon known as bipolar snap back that returns the device to steady-state once the ESD pulse has been safely shunted to ground. The gate-coupled nMOS transistor features a relatively low breakdown voltage because of the MOS-current initiated by the temporary gate bias. The gatecoupled nMOS device has proven to be superior to a grounded-gate nMOS transistor especially for multifinger transistor layouts within the integrated circuit where uniform triggering of all fingers is essential for a high ESD performance. However, a potential problem of the gate-coupled nMOS transistor is that the gate bias is not very well defined. Specifically, the gate bias depends on the amplitude and on the rise time (dV/dt) of the applied ESD pulse as the signal is applied across the RC circuit. Depending on the transient gate voltage, the intended uniform triggering of the nMOS device may or may not be established.

Another way of adjusting the trigger voltage of ESD protection elements and of insuring more uniform current flow is to either establish a gate bias and/or a substrate (p-well) bias using a Zener breakdown device in series with a resistor. FIG. 2 depicts a schematic of an ESD protection device that has an nMOS transistor Q with a Zener diode Z coupled from the gate terminal to a pad of the integrated circuit and a resistor R coupled from the gate terminal to ground. The trigger voltage for the ESD protection device is defined by the Zener diode Z breakdown voltage which can be made lower than the drain/p-well junction breakdown trigger mechanism of FIG. 1. The resistor R serves to shunt leakage current through the Zener diode Z to ground, preventing multiplication by the current gain of the parasitic NPN transistor Q'.

Alternatively, a capacitor C (shown in phantom) can be employed in lieu of the Zener diode Z. The capacitor C provides a trigger current in response to the high dV/dt of the ESD pulse. However, the amount of gate bias is limited in both cases by the forward voltage drop of the base-emitter junction of the parasitic NPN transistor Q'.

Therefore, there is a need in the art for a ESD protection device that does not rely on the ESD amplitude and rise time to bias the ESD device elements.

SUMMARY OF THE INVENTION

The disadvantage associated with the prior art are overcome by apparatus for providing electrostatic discharge (ESD) protection having an nMOS transistor with bias simultaneously applied to a gate and a p-well of the nMOS transistor. A bias circuit is fabricated using a plurality of the Zener diodes. The double bias allows for a relatively high gate voltage to be applied to the nMOS transistor enabling the nMOS transistor to be biased to optimum conditions for bipolar snapback.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
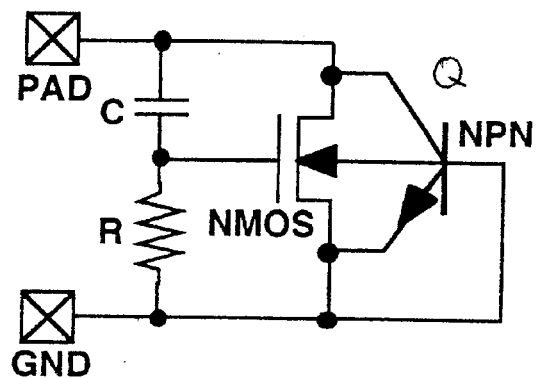
FIG. 1 depicts a schematic diagram of a prior art gate-coupled nMOS transistor device used for ESD protection.
Figure 2:
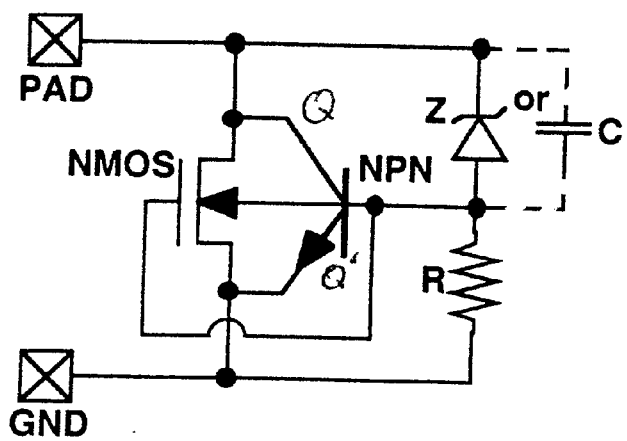
FIG. 2 depicts a schematic diagram of a prior art Zener triggered nMOS structure for ESD protection.
Figure 3:
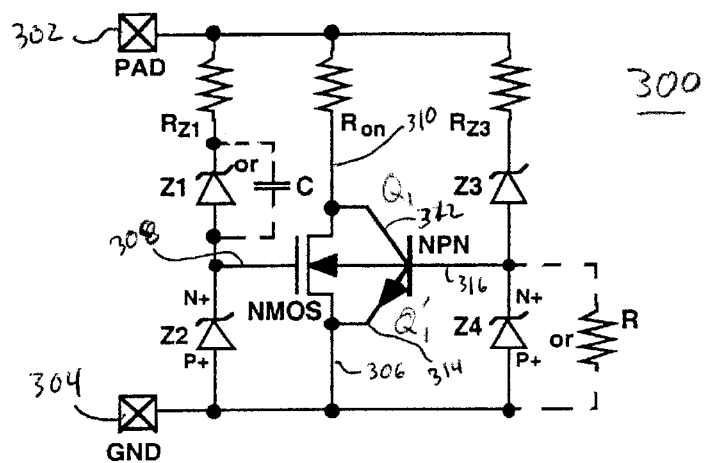
FIG. 3 depicts a schematic diagram of a first embodiment of the invention.

FIG. 3 depicts a schematic diagram of a simultaneous gate and substrate biased (GSB) nMOS transistor structure 300 that forms a first embodiment of the present invention. The structure 300 is coupled between a pad 302 of an integrated circuit and ground 304. The structure 300 couples an electrostatic discharge (ESD) from the pad 302 to ground 304 to protect the integrated circuit from being damaged or otherwise impaired. The physical construction of the structure 300 comprises an nMOS transistor $Q_1$ (with its parasitic NPN bipolar transistor shown as $Q'_1$) and a plurality of Zener diodes Z1, Z2, Z3 and Z4. The nMOS transistor $Q_1$ comprises a source terminal 306, a gate terminal 308, and a drain terminal 310. The parasitic NPN transistor Q', has a collector 312 coupled to the drain terminal 310, an emitter 314 coupled to the source terminal 306 and a base 316, which is formed by a p-well or channel region of the nMOS transistor $Q_1$.

The Zener diodes are arranged to simultaneously provide a controlled bias voltage to the base of the parasitic transistor Q' and the gate of the transistor $Q_1$. The first Zener diode Z1 is coupled between the gate 308,of transistor $Q_1$ and the pad 302, while the second Zener diode Z2 is coupled from the gate 308 of transistor $Q_1$ to ground 304. More specifically, the anode terminal of the Zener diode Z2 is coupled to ground 304 and the cathode terminal is coupled to the gate 308, while the anode terminal of Zener diode Z1 is coupled to the gate 308 and the cathode terminal is coupled to the pad 302. The combination of Zener diodes Z1 and Z2 provide a defined gate bias voltage for the nMOS transistor $Q_1$. The resistor $R_{Z1}$ shown in the circuit is the internal (parasitic) resistance of Zener diode Z1.

In FIG. 3, a resistor $R_{on}$ is shown coupled between the transistor $Q_1$ drain 310 and pad 302 to depict the internal resistance of the transistor $Q_1$ when the transistor is active.

A p-well- or base-biasing circuit is formed from Zener diode Z3 and Zener diode Z4. Zener diode Z3 has its anode terminal coupled to the base 316 of the NPN transistor portion $Q'_1$ of transistor $Q_1$. The cathode terminal of Zener diode Z3 is coupled to the pad 302. Resistor $R_{Z3}$ is depicted to show the internal resistance of Zener diode Z3. The Zener diode Z4 has an anode terminal coupled to ground 304 and the cathode terminal coupled to the base 316 of the NPN transistor portion of transistor portion $Q'_1$ of transistor $Q_1$.

Zener diodes Z1 and Z3 provide low voltage triggering for the ESD protection device 300. Zener diodes Z2 and Z4 provide the bias voltage for both gate and p-well of the nMOS transistor Q, and its inherent parasitic NPN bipolar transistor $Q'_1$. This double bias is an improvement to the prior art ESD protection devices inasmuch as it allows for a higher gate voltage to be applied to the nMOS transistor $Q_1$ enabling the nMOS transistor to be biased to optimum conditions for bipolar snapback. Such snapback is particularly important for multifinger integrated circuit devices wherein the individual fingers tend to trigger independently. If the resulting bipolar snapback is large, the other fingers of the integrated circuit may be prevented from reaching a voltage necessary to induce bipolar snapback before the conducting finger is damaged reducing the ability of the structure to handle ESD.

To ensure uniform triggering, the voltage at the gate 308 of the nMOS transistor $Q_1$ is established at approximately half the pad to ground voltage before the bipolar NPN base 316 is triggered. Therefore, optimally the breakdown voltage of Zener diode Z1 is less than the breakdown voltage of Zener diode Z3. Also, the voltage at the gate 308 of the nMOS transistor $Q_1$ should be limited to ensure proper triggering. Such a voltage limitation can be achieved by the use of the N+/P+ (abrupt junction) Zener diode Z2. This structure acts essentially as a voltage dependent resistor. At voltages of less than one volt, the leakage current is small through Zener diode Z2 and the effective resistance is high, which enables the voltage of the gate 308 of the nMOS transistor $Q_1$ to rise quickly to above the threshold level. As the current through Z1 increases, the voltage across Zener diode Z2 increases and the effective resistance decreases. When the voltage across Zener diode Z2 reaches approximately four volts, the voltage at the gate of the nMOS transistor $Q_1$ is clamped to an optimal voltage to ensure uniform triggering.

An alternative to using Zener diode Z1 is to use capacitor C (shown in phantom). Using a capacitor in lieu of a Zener diode is preferred when the desired trigger voltage is low, i.e., when it would be impossible to fabricate a low voltage Zener diode for this application.

Figure 4:
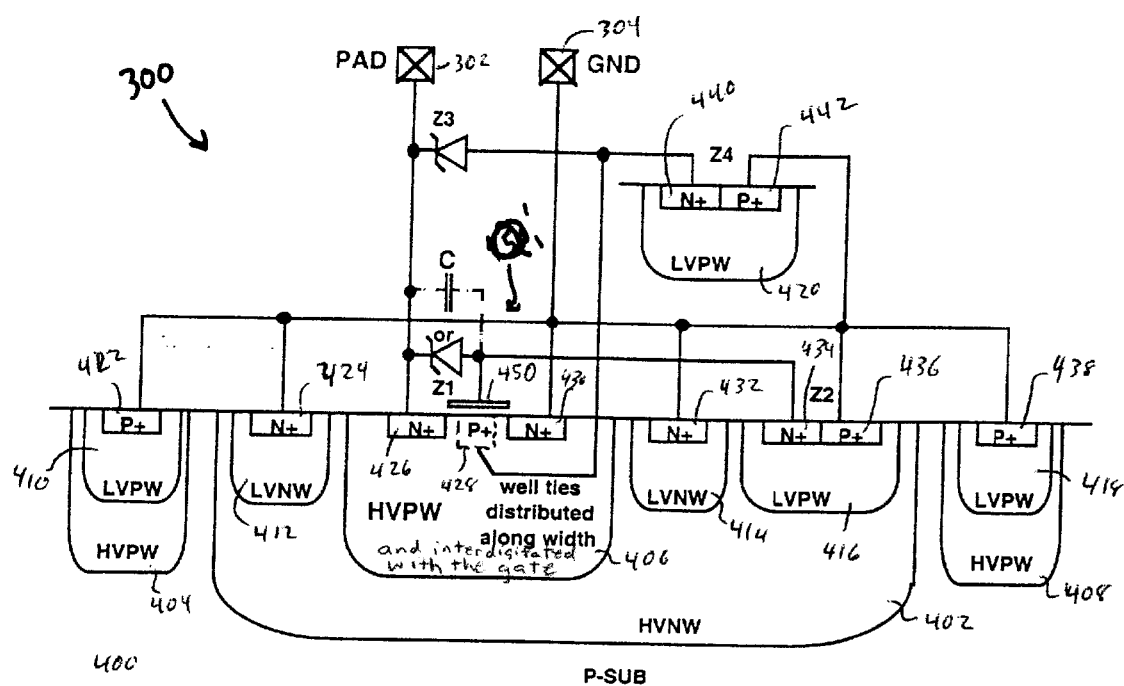
FIG. 4 depicts a cross section of a gate and substrate biased nMOS transistor structure in accordance with the first embodiment of the invention.

Further increase in the current through Z1 after the breakdown voltage is exceeded, essentially results in a voltage drop across its parasitic resistance $R_{Z1}$. The current shunt path across the emitter-base junction of the bipolar NPN portion of transistor $Q'_1$ may be a resistor R (shown in phantom) or an N+/P+ Zener diode Z4. The advantage of using a Zener diode Z4 compared to a resistor R is that the typical resistor values are only as high as several kilo-ohms. The initial resistance of Zener diode Z4 is much higher, thus the base emitter potential accumulates rapidly to uniformly turn on the NPN portion $Q'_1$ of transistor $Q_1$. The leakage current through Zener diode Z4 at low voltage is much higher than that of the leakage current through Zener diode Z3. This leakage current difference prevents the bipolar NPN transistor from being turned on before the nMOS current is established and prevents the bipolar NPN transistor $Q'_1$ from being turned on during normal circuit operation FIG. 4 depicts a vertical cross section of the physical structure of the nMOS structure 300 of the present invention. The structure 300 is produced using a conventional CMOS process on a p-type substrate (P-SUB) 400. The retrograde high voltage n-well (HVNW) 402 incorporates a heavily-doped buried-region that is introduced into the substrate first. Formation of the HVNW is followed by formation of the high voltage p-wells (HVPW) 404, 406 and 408 and/or low voltage p-wells (LVPW) 410, 416, 418 and 420 and formation of the low voltage n-wells (LVNW) 412 and 414. A gate oxide is grown on the surface of the substrate, a polysilicon layer is then deposited and defined to form the gate 450 of the NMOS transistor $Q_1$. Lastly, N+ and P+ regions 422, 424, 426, 428, 430, 432, 434, 436, 438, 440, and 442 are diffused into the substrate 400.

The low voltage triggering Zener diodes Z2 and Z4 are formed by twosided abrupt N+/P+ junctions 434/436 and 440/442. The abrupt N+/P+ junction features very well defined break down voltages of about four volts which is optimum for the gate bias level. In case of the p-well/base bias, the Zener diode behaves essentially as a high ohmic resistor to quickly establish a base-emitter voltage. In case of the nMOS gate bias, the Zener diode Z2 forms first a high ohmic resistor to quickly establish a gate voltage above threshold, and then limits the voltage to a value independent of the ESD pulse or signal applied to the pad 302

FIG. 4 shows a high voltage n-well 402 into which the high voltage p-well 406 is implanted electrically isolating the p-well in which $Q_1$ is formed from the p-substrate 400. This allows for more precise control of the triggering of transistor $Q_1'$ than would be possible if the HVPW 406 was directly diffused into the p-substrate 400. If the HVPW 406 were directly diffused into the p-substrate, the base-to-ground shunt resistor R, shown in phantom in FIG. 3, would be real and not well defined, leading to variations in the ESD voltage necessary to trigger transistor $Q_1'$. The high voltage n-well 402 may be connected to a separate positive bias voltage, such as the supply voltage for the integrated circuit, or to ground, as shown in FIG. 4. The latter has the advantage that, in addition to the lateral NPN transistor $Q_1'$ formed by the diffusions into regions 426, 406, 430, an additional vertical NPN transistor is formed.

The retrograde HVNW 402 acts as an emitter, the N+ region 426 connected to the pad 302 acts as a collector, and the HVPW 402 acts as a base to form the additional parasitic bipolar transistor $Q_1'$ of FIG. 3. It should be understood that this double (vertical and lateral) NPN action is not essential to the invention but is available in some CMOS processes. Other, simpler, processes may only allow vertical NPN formation of the parasitic bipolar transistor $Q'_1$. Zener diodes Z1 and Z3 may be constructed using conventional P(N)LDD and P(N)+ diffusions (not shown) into the substrate 400.

Under reverse polarity ESD stress (Pad Stressed negatively versus ground), the Zener diodes act as series connected, forward conducting diodes. Zener diode Z3 causes the HVPW 406 to be forward biased, which activates a lateral NPNP SCR, thus providing superior clamping to that provided by the series connected Zener diodes alone. The lateral NPNP SCR is formed by the N+ region 426, the HVPW 406, the HVNW 402 and the P-type substrate 400. It is understood that the reverse polarity protection may also be provided by a separate diode which is not shown as part of the structure shown in FIG. 4.

Figure 5:
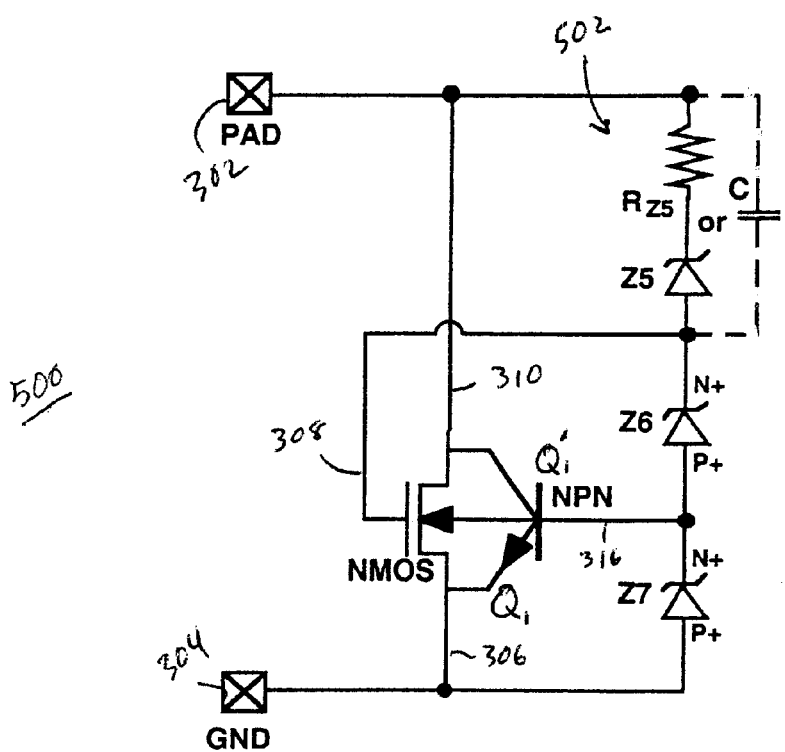
FIG. 5 depicts a schematic diagram of an alternative embodiment of the present invention.

FIG. 5 depicts a schematic diagram of an alternative embodiment of an ESD device 500 having a circuit 502 for accomplishing a simultaneously biased nMOS gate and NPN base region. This alternative approach is a very efficient way to apply the optimum bias for an nMOS transistor $Q_1$ and an NPN transistor $Q_1'$. Another advantage is that the trigger voltage of the entire circuit can be adjusted with one Zener diode Z5.

In this alternative embodiment, three Zener diodes Z5, Z6, and Z7 are used to simultaneously bias the nMOS gate and the bipolar base to establish optimal triggering of the structure 500. Zener diode Z7 has an anode terminal coupled to ground 304 and a cathode terminal coupled to the base 316 of the parasitic NPN transistor $Q_1'$. The Zener diode Z6 has an anode terminal coupled to the base 316 and a cathode terminal coupled to the gate terminal 308. The Zener diode Z5 has an anode terminal coupled to the nMOS gate terminal 308 and the cathode terminal coupled to the pad 302. The internal resistance of Zener diode Z5 is represented by resistor $R_{Z5}$.

The simultaneous bias of the gate and base is obtained by linking the two bias voltages through a common low voltage triggering Zener diode Z6. A low voltage triggering Zener diode Z7 is used as a high-ohmic voltage-dependent resistor providing the bias for the base region of the NPN transistor as in the first embodiment of the invention. The other Zener diode Z6 that is connected in series with Zener diode Z7 provides the gate bias for the nMOS transistor Q1. The nMOS gate bias equals the NPN transistor's base-emitter voltage Vbe plus the reverse voltage across Zener diode Z6. The nMOS gate voltage is established very quickly as the Zener diodes Z6, Z7 and Z8 have a high internal resistance. As the current through Zener diodes Z5 and Z6 increases, the base voltage of the NPN transistor rises and provides the base current that activates the NPN transistor $Q'_1$. The nMOS gate bias is still in the optimum region as it is limited at a maximum value of Vbe (about 0.7 volts) plus the breakdown voltage of Zener diode Z6 (about 4 volts). Thus, the gate bias is only shifted by Vbe as compared to the first embodiment of the invention. Since the voltage at the nMOS transistor gate will rise faster than the voltage at the base of the NPN transistor, the ESD device 500 always ensures that the nMOS transistor turns on before the NPN transistor.

Activating the structure 500 by only one Zener diode Z5 overcomes the need to manufacture trigger devices (for example Zeners Z1 and Z4 of FIG. 3) which must differ in their trigger voltage. The latter could be a problem in some manufacturing processes. Alternatively, in lieu of trigger device Zener diode Z5, a capacitor C may be used for applications where the trigger voltage has to be very low. The capacitor C establishes a higher gate potential than base potential to turn on the nMOS transistor before the NPN transistor.

As in the first embodiment of the invention, the low voltage triggering Zener diodes Z6 and Z7 are formed by two sided abrupt N+/P+ junctions.

Although various embodiments which incorporate the teachings of the present invention have been shown and described in detail herein, those skilled in the art can readily devise many other varied embodiments that still incorporate these teachings.

What is claimed is:

1. Apparatus for providing electrostatic discharge protection for an integrated circuit it having a a pad comprising
   an nMOS transistor having a gate, a source and a drain, where the nMOS transistor is formed in a p-well, the drain is connected to said pad and the source is connected to ground;
   a bias circuit, coupled to said nMOS transistor, for contemporaneously biasing said gate and said p-well, wherein said bias circuit comprises a first Zener diode having the cathode coupled to the gate of said nMOS transistor and the anode coupled to ground.

2. The apparatus of claim 1 wherein said bias circuit comprises a first bias circuit for biasing said gate and a second bias circuit for independently biasing said p-well.

3. The apparatus of claim 1 wherein said nMOS transistor further comprises:
   a parasitic NPN bipolar transistor having a collector coupled to the drain, an emitter coupled to the source, and a base coupled to the p-well of the nMOS transistor.

4. The apparatus of claim 3, wherein said bias circuit ensures that the nMOS transistor is activated before the NPN bipolar transistor is activated.

5. The apparatus of claim 3, wherein said bias circuit further comprises:
   a second Zener diode connected between said gate and a pad;
   a third Zener diode is connected between said base and said pad; and
   a fourth Zener diode is connected between said base and ground.

6. The apparatus of claim 5 wherein said second and third zener diodes have differing breakdown voltages.

7. The apparatus of claim 6 wherein second and fourth zener diodes are abrupt junction diodes.

8. The apparatus of claim 5, wherein said first and fourth Zener diodes have breakdown voltages of approximately four volts.

9. The apparatus of claim 3, wherein said bias circuit further comprises:
   a capacitor connected between said gate and a pad;
   a second Zoner diode connected between said base and said pad; and
   a third Zener diode connected between said base and ground.

10. The apparatus of claim 3, wherein said bias circuit comprises:
    a second Zener diode connected between said gate and a pad;
    a third Zener diode is connected between said base and said pad; and
    a resistor is connected between said base and ground.

11. The apparatus of claim 3, wherein said bias circuit fird comprises:
    a capacitor connected between said gate and a pad;
    a second Zener diode is connected between said base and said pad; and
    a resistor is connected between said base and ground.

12. The apparatus of claim 5, wherein the breakdown voltage of the second Zener diode is less than the breakdown voltage of the third Zener diode.

13. The apparatus of claim 5, wherein during an ESD event, a low voltage leakage current through said fourth Zener diode exceeds a leakage current through the third Zener diode, such that the nMOS transistor is activated before the parasitic NPN bipolar transistor turns on.

14. The apparatus of claim 5, wherein during an ESD event the voltage potential of the gate of the nMOS transistor is claimped at the breakdown voltage of said first Zener diode.

15. The apparatus of claim 5, wherein the breakdown voltage of the fourth Zener diode is less than the breakdown voltage of the third Zener diode.

16. The apparatus of claim 15, wherein during an ESD event, a low voltage leakage current through said fourth Zener diode exceeds a leakage current through the third Zener diode, such that the nMOS transistor is activated before the parasitic NPN bipolar transistor turns on.

17. Apparatus for providing electrostatic discharge protection for an integrated circuit having a pad comprising:
   an nMOS transistor having a gate, a source and a drain, where the nMOS transistor is formed in a p-well, the drain is connected to said pad and the source is connected to ground;
   a parasitic NPN bipolar transistor having a collector coupled to the drain, an emitter coupled to the source, and a base coupled to the p-well of the nMOS transistor;
   a bias circuit, coupled to said nMOS transistor, for contemporaneously biasing said gate and said p-well, wherein said bias circuit comprises:
   a triggering device connected between said gate and a pad;
   a first Zener diode connected between said gate and the base; and
   a second Zener diode connected betwee said base and ground.

18. The apparatus of claim 17, wherein said first and second Zener diodes are abrupt junction diodes.

19. The apparatus of claim 17, wherein said triggering device comprises a capacitor connected between said gate and the pad said first Zener diode further connected between said gate and base; and
   a second Zener diode connected between said base and ground.

20. The apparatus of claim 17, wherein said triggering device comprises a third Zener diode connected between said gate and the pad.

* * * * *

UNITED STATES PATENT AND TRADEMARK OFFICE
CERTIFICATE OF CORRECTION

PATENT NO. : 6,501,632 B1  Page 1 of 1
DATED : December 31, 2002
INVENTOR(S) : Leslie Ronald Avery and Christian Cornelius Russ It is certified that error appears in the above-identified patent and that said Letters Patent is hereby corrected as shown below:

Column 1,
Line 40, please change "gatecoupled" to -- gate-coupled --.

Column 2,
Line 63, please change "Q'" to -- $Q'_1$ --.

Column 3,
Line 24, please change "Q," to read -- $Q_1$ --.

Column 6,
Line 59, please change "fird" to read -- further --.

Column 7,
Line 12, please replace claim 16 in its entirety with: -- The apparatus of claim 5, wherein the breakdown voltage of the first Zender diode is less than the breakdown voltage of the second Zener diode. --

Column 8,
Line 10, please change "betwee" to read -- between --.

Signed and Sealed this

Twenty-ninth Day of April, 2003

JAMES E. ROGAN
*Director of the United States Patent and Trademark Office*